(12) United States Patent
Ganther, Jr. et al.

(10) Patent No.: US 6,420,868 B1
(45) Date of Patent: Jul. 16, 2002

(54) READ-OUT ELECTRONICS FOR DC SQUID MAGNETIC MEASUREMENTS

(75) Inventors: Kenneth R. Ganther, Jr., Olathe, KS (US); Lowell D. Snapp, Independence, MO (US)

(73) Assignee: Honeywell International Inc., Morris County, NJ (US)

( * ) Notice: Subject to any disclaimer, the term of this patent is extended or adjusted under 35 U.S.C. 154(b) by 140 days.

(21) Appl. No.: 09/596,190

(22) Filed: Jun. 16, 2000

(51) Int. Cl.$^7$ ............................................. G01R 33/035
(52) U.S. Cl. ........................................ 324/248; 505/846
(58) Field of Search ............................... 324/248, 235, 324/225, 239, 240; 505/846

(56) References Cited

U.S. PATENT DOCUMENTS

| | | | |
|---|---|---|---|
| 4,004,217 A | 1/1977 | Giffard | 324/43 |
| 4,389,612 A | 6/1983 | Simmonds et al. | 324/248 |
| 4,851,776 A | 7/1989 | Goto et al. | 324/248 |
| 5,095,270 A | 3/1992 | Ludeke | 324/248 |
| 5,173,659 A | 12/1992 | Chiba et al. | 324/248 |
| 5,231,353 A | 7/1993 | Nakayama et al. | 324/248 |
| 5,469,057 A | * 11/1995 | Robinson | 324/248 |
| 5,532,592 A | 7/1996 | Colclough | 324/248 |
| 5,574,369 A | * 11/1996 | Hibbs | 324/248 |
| 5,635,834 A | * 6/1997 | Sloggett et al. | 324/248 |
| 6,123,902 A | * 9/2000 | Koch et al. | 422/50 |

OTHER PUBLICATIONS

Clarke, J., SQUID Sensors: Fundamentals, Fabrication and Applications, H. Weinstock ed., Kluwer Academic Press, Dordrecht, 1996, pp. 1–62.

Drung, D., Advanced SQUID Read–Out Electronics in SQUID Sensors: Fundamentals, Fabrication and Applications, H. Weinstock, ed., Kluwer Academic Press, Dordrecht, 1996, pp. 63–116.

Kung, P.J., Bracht, R.R., Flynn, E.R., Lewis, P.S., A direct current superconducting quantum interference device gradiometer with a digital signal processor controlled flux–locked loop and comparison with a conventional analog feedback scheme, Rev. Sci. Instrum. 57 (1), Jan. 1996, pp. 222–229.

Kraus Jr., R.H., Bracht, R., Flynn, E.R., Jia, Qu., Maas, P., Reagor, D., and Stettler, M., A digital flux–locked loop for high temperature SQUID magnetometer and gradiometer systems with field cancellation, to be published.

Wellstood, F., Heiden, C., and Clarke, J., Integrated dc SQUID magnetometer with a high slew rate, Rev. Sci. Instrum. 55(6), Jun. 1984, pp. 952–957.

Matlashov, A., Kraus, Jr., R.H., Espy, M., Ruminer, P., Atencio, L., Garachtchenko, A., Sequential Read–out Architecture for Multi–Channel SQUID Systems, IEEE Transactions on Applied Superconductivity, vol. 9, No. 2, Jun. 1999, pp. 3672–3675.

Ruthroff, C.L., Some Borad–Band Transformers, Proceedings of the IRE, Aug., 1959, pp. 1337–1342.

* cited by examiner

Primary Examiner—Edward Lefkowitz
Assistant Examiner—Darrell Kinder
(74) Attorney, Agent, or Firm—Hovey Williams LLP (57) ABSTRACT

Read-out electronics for DC SQUID sensor systems, the read-out electronics incorporating low Johnson noise radio-frequency flux-locked loop circuitry and digital signal processing algorithms in order to improve upon the prior art by a factor of at least ten, thereby alleviating problems caused by magnetic interference when operating DC SQUID sensor systems in magnetically unshielded environments.

13 Claims, 6 Drawing Sheets

Figure 6
Digital Signal Processor (DSP)

READ-OUT ELECTRONICS FOR DC SQUID MAGNETIC MEASUREMENTS

RELATED APPLICATIONS

This application is related to the co-pending patent application entitled "A Fast Flux Locked Loop", Ser. No. 09/596,135, filed Jun. 16, 2000, and the co-pending patent application entitled "Frequency Multiplexed Read-out Architecture for Multi-Channel DC SQUID Systems", Ser. No. 09/596,137, filed Jun. 16, 2000 now U.S. Pat. No. 6,356,578, both of which are hereby incorporated into the present invention by reference.

FEDERALLY SPONSORED RESEARCH OR DEVELOPMENT

The U.S. government has a paid-up license in this invention and the right in limited circumstances to require the patent owner to license others on reasonable terms as provided for by the terms of contract No. DE-AC04-76-DP00613 awarded by the United States Department of Energy.

BACKGROUND OF THE INVENTION

1. Field of the Invention

The present invention relates to electronic read-out devices, and, more particularly, to devices for providing improved electronic read-out of magnetic measurements made by direct current superconducting quantum interference devices (DC SQUIDs).

2. Description of the Prior Art

DC SQUIDs are small, cryogenically-cooled magnetic sensors that comprise a ring of superconducting material interrupted by two Josephson junctions. DC SQUIDs are designed to detect changes in magnetic flux, and, when suitably biased with a small DC current, will exhibit a magnetic flux sensitivity noise floor of approximately $1\times10^{-6}$ $\Phi_0/\sqrt{Hz}$ for low temperature devices that operate near 4 degrees Kelvin (typically cooled by liquid Helium), and approximately $7\times10^{-6}$ $\Phi_0/\sqrt{Hz}$ for high temperature devices that operate near 77 degrees Kelvin (typically cooled by liquid Nitrogen). Furthermore, DC SQUIDs exhibit a transfer function that converts magnetic flux into a periodic electrical output signal.

The standard read-out method for DC SQUID measurements is to inject an alternating current (AC) magnetic field modulation signal into the DC SQUID and then, using a flux locked loop (FLL) circuit, sense changes in the modulating signal due to external magnetic fields. The FLL maintains a stable magnetic flux operating point at the DC SQUID by introducing a feedback magnetic flux that precisely counteracts the externally applied magnetic field, provided the slew rate and dynamic range of the DC SQUID and FLL are not exceeded. Measurements of the external magnetic flux can be made by measuring the feedback signal which is an identical image of the external magnetic flux signal within the tracking bandwidth of the FLL.

DC SQUID sensor systems for non-destructive testing/evaluation of materials or structures or for biomagnetic measurements are not yet practical for use in a field setting (i.e., environments containing high levels of magnetic interference). The art has been limited to a flux modulation frequency of approximately 500 KHz with a maximum tracking loop bandwidth of 250 KHz. In magnetically unshielded environments, large amplitude or high slew rate external stray magnetic fields from 50/60 Hz AC power lines, AM broadcast transmitters, small changes in the Earth's magnetic field, and other sources, cause the FLL to lose lock, thereby invalidating any measurement in progress. Furthermore, the prior art employs traditional twisted-pair wires which are highly undesirable for several reasons: they have a high degree of linear attenuation versus frequency that severely distorts square waves of even moderate frequencies, they allow for a large amount of radiated leakage and corresponding susceptibility to radio-frequency interference, and they have a highly variable characteristic impedance that changes with mechanical stress and is difficult to impedance match.

The incorporation of digital signal processing (DSP) technology into the FLL of a DC SQUID has been attempted, but results have been limited due to inherent delays associated with signal acquisition, processing and reconstruction of the feedback signal, and the maximum clock frequency of the DSP. Because of these problems, previous attempts to incorporate DSP into an FLL have failed to increase the operating frequency above that obtainable with standard analog read-out systems.

For these reasons, DC SQUIDs are restricted to controlled environments which are shielded from magnetic interference and are typically expensive, bulky, and non-portable.

SUMMARY OF THE INVENTION

The read-out electronics of the present invention include essential enabling technology which makes the operation of DC SQUIDs practical in unshielded environments by alleviating the effects of high levels of magnetic interference on DC SQUID measurements. More particularly, the read-out electronics of the present invention incorporate innovative circuit designs that extend the frequency of operation of FLLs and improve upon the prior art by a factor of at least ten. Furthermore, the present invention employs DSP algorithms to filter, extract, and measure the desired weak signal. The problems encountered in prior attempts to incorporate DSP technology into DC SQUID read-out electronics have been overcome in the present invention by locating the DSP outside of the FLL.

In the read-out electronics of the present invention, traditional twisted-pair wires are replaced by shielded, unbalanced, controlled-impedance transmission lines which overcome many of the problems encountered in the prior art, including reducing the amount of radiated leakage and corresponding susceptibility to radio-frequency interference.

The primary application of the present invention is in magnetic measurement and non-destructive testing/evaluation (NDT/NDE) of materials and structures. There are both weapon and non-weapon NDT/NDE applications; the most notable non-weapon application being the detection of hidden cracks and corrosion in aging aircraft structures. The invention may also have application in making biomagnetic and geomagnetic measurements.

These and other important aspects of the present invention are more fully described in the section entitled Detailed Description, below.

BRIEF DESCRIPTION OF THE DRAWINGS

A preferred embodiment of the present invention is described in detail below with reference to the attached drawing figures, wherein.

DETAILED DESCRIPTION OF THE PREFERRED EMBODIMENT

Figure 1:
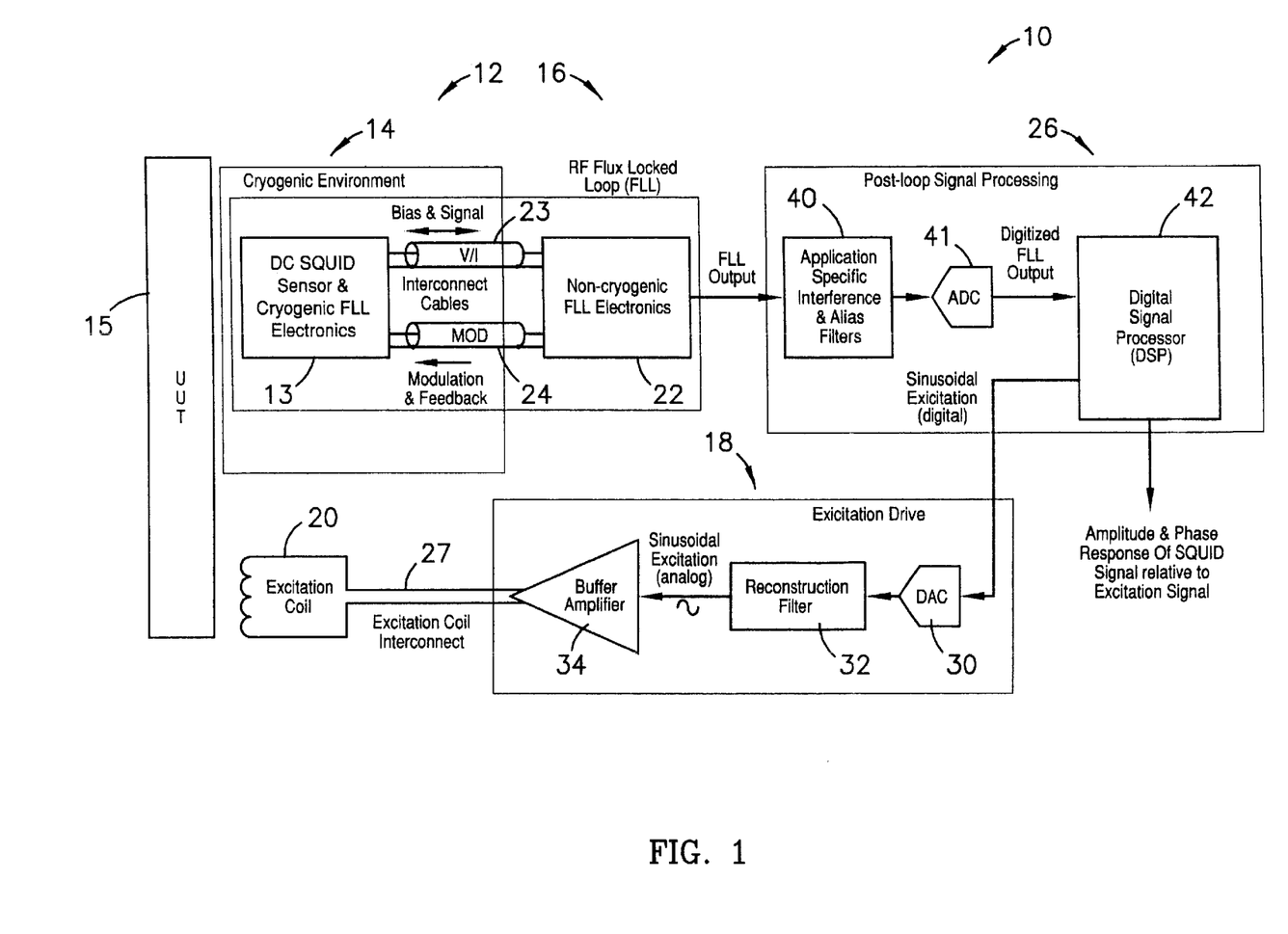
FIG. 1 is a block diagram illustrating a first preferred embodiment of the major components of the read-out electronics of the present invention.
Figure 2:
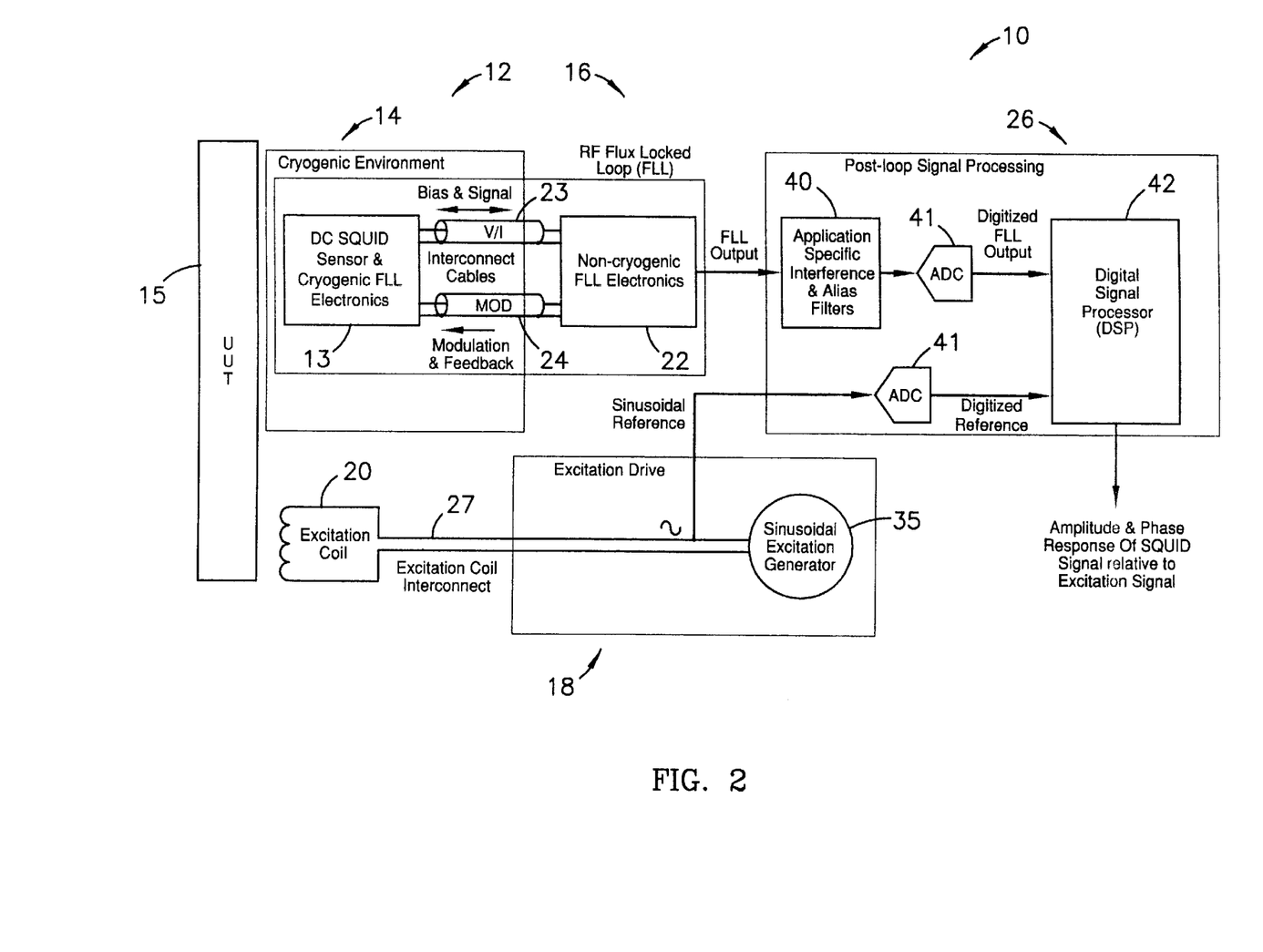
FIG. 2 is a block diagram illustrating a second preferred embodiment of the major components of the read-out electronics of the present invention.

Referring to FIGS. 1 and 2, a DC SQUID magnetic measurement system 10 is shown comprising cryogenic components 12, including a DC SQUID sensor 13, and associated non-cryogenic read-out electronics 16. Such a system 10 is typically used in the non-destructive testing and evaluation of a unit under test 15 in order to detect, for example, hidden cracks, corrosion, or other flaws. The cryogenic components 12 include a DC SQUID sensor 13 located within a cryogenic environment 14, all of which is well-known in the art. The read-out electronics 16 comprise four major components: an excitation drive 18 and excitation coil 20; a flux locked loop 22; and a post-loop signal processor 26.

1. Excitation Drive 18 and Coil 20

Referring to FIGS. 1 and 2, the excitation drive 18 and excitation coil 20 operate together to magnetically stimulate the unit under test 15 with a sinusoidal excitation signal. One preferred embodiment of the excitation drive 18 is shown in FIG. 1 and comprises three major components: a digital-to-analog converter 30; a reconstruction filter 32; and a buffer amplifier 34. An alternate and equally preferred embodiment of the excitation drive 18 is shown in FIG. 2, wherein the sinusoidal excitation signal is produced using hardware rather than digital signal processing technology and the excitation drive 18 functions only to send a sinusoidal reference signal output, which represents the sinusoidal excitation signal, to the post-loop signal processor 26. The excitation coil 20 is well-known in the art, and the read-out electronics 16 of the present invention are independent of and adaptable to any prior art excitation coil.

Referring to FIG. 1, for non-destructive testing and evaluation applications, the unit under test 15 is stimulated magnetically via the excitation coil 20 by an excitation signal produced by the post-loop signal processor 26 and enhanced by the excitation drive 18. In one preferred embodiment, the excitation signal is a digital sinusoidal signal generated by a digital signal processor 42 component of the signal processor 26, as described below. This digital sinusoidal signal is converted to a clean analog sinusoidal signal by the digital-to-analog converter 30 and the reconstruction filter 32 of the excitation drive 18. The clean analog sinusoidal signal is amplified by the buffer amplifier 34 and drives the excitation coil 20 via a pair of signal leads 27.

The DC SQUID sensor 13 senses the response of the unit under test 15 to the excitation signal applied via the excitation coil 20, and the flux locked loop 22 recovers the response as described in the co-pending patent application entitled "A Fast Flux Locked Loop", Ser. No. 09/596,135, filed Jun. 16, 2000.

2. Shielded, Unbalanced, Controlled Impedance Upper and Lower Transmission Lines 23,24

Referring to FIGS. 1 and 2, an upper transmission line 23 and a lower transmission line 24 couple the DC SQUID sensor 13 to the flux locked loop 22, as described in the copending application entitled "A Fast Flux Locked Loop", Ser. No. 09/596,135, filed on Jun. 16, 2000. The upper and lower transmission lines 23,24 are preferably shielded, unbalanced, and matched at each end. Shielded transmission lines allow the flux locked loop 22 to be operated at much higher modulation frequencies with correspondingly higher tracking bandwidths. In the preferred embodiment, coaxial cable is used for the upper and lower transmission lines 23,24, though other types of transmission line, such as stripline, can be used in place of coaxial cable. Furthermore, the upper and lower transmission lines 23,24 can be of any characteristic impedance, including 50 Ohms, which is RF industry standard and used in the preferred embodiment of the read-out electronics of the present invention. By using upper and lower transmission lines 23,24 which are shielded from RF interference, the entire flux locked loop 22 can, at the discretion of the user, be fully RF shielded all the way to and including the DC SQUID sensor 13. Magnetic fields of interest can penetrate this RF shield.

3. Radio-Frequency Flux Locked Loop 22

Figure 3:
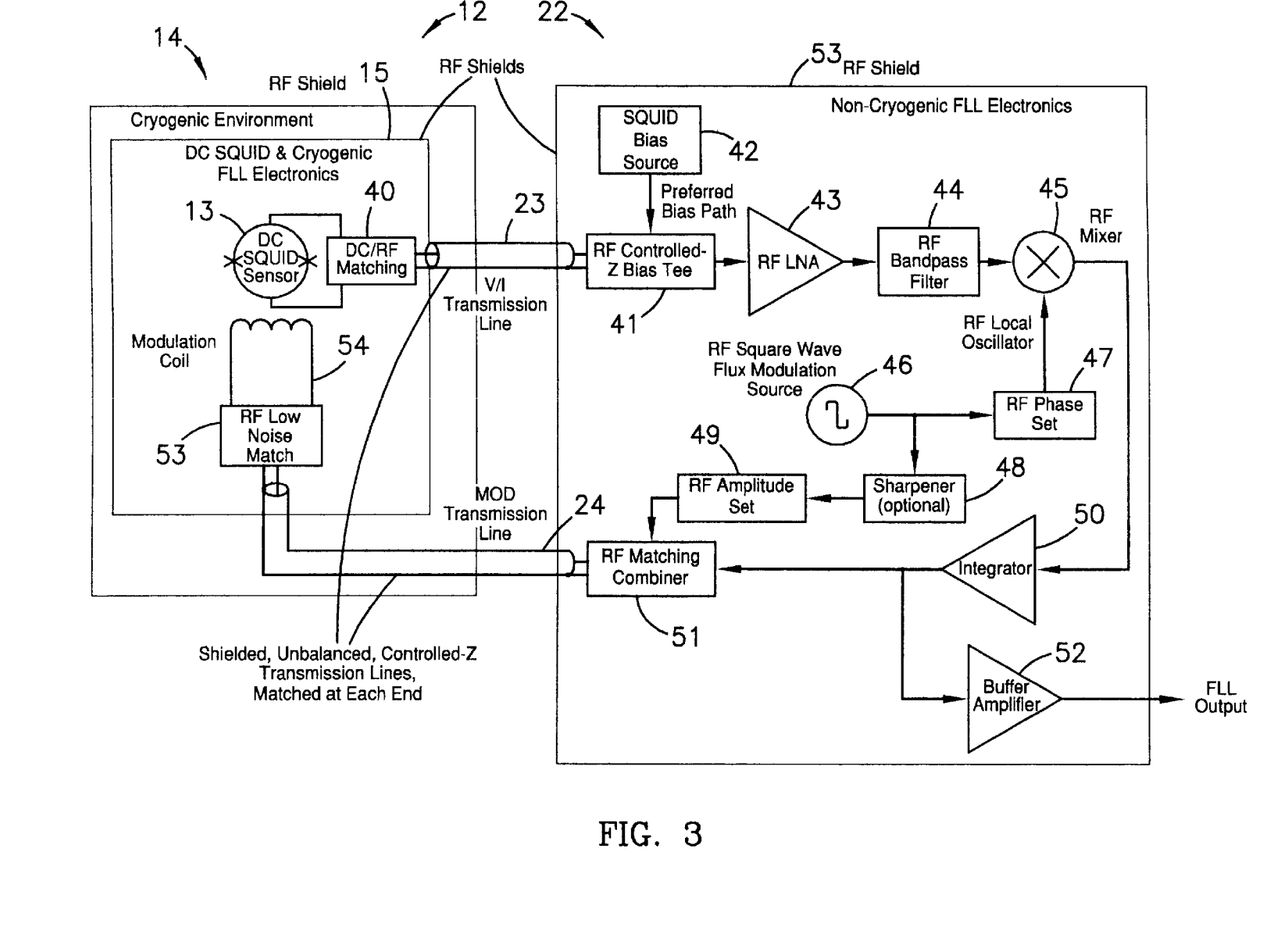
FIG. 3 is a block diagram illustrating a preferred embodiment of the flux locked loop component of the present invention.
Figure 4:
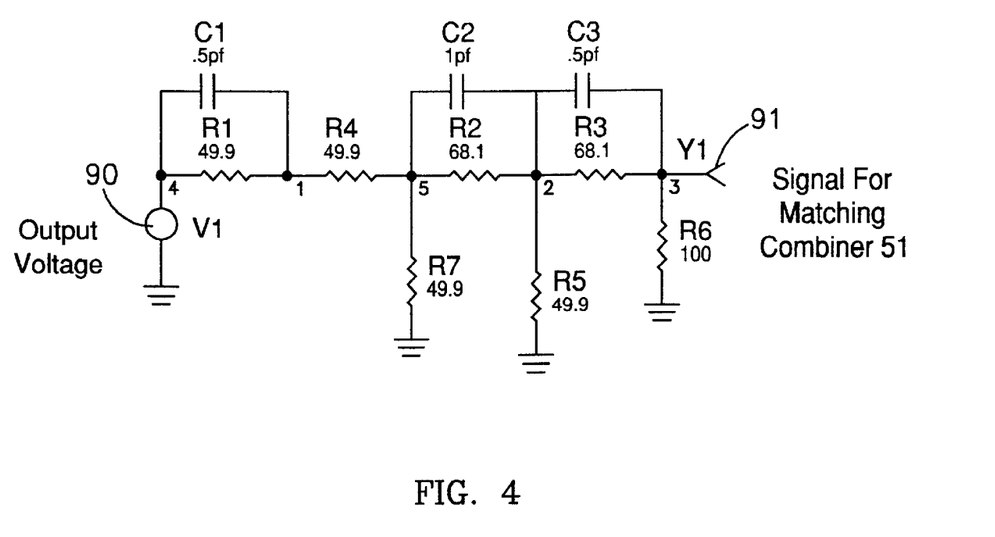
FIG. 4 is a circuit diagram illustrating a preferred embodiment of the sharpener circuit of the present invention.

Referring to FIG. 3, the radio-frequency flux locked loop 22 provides negative feedback to the DC SQUID sensor 13 in order to keep the sensor 13 in linear operation and maintain a stable operating point. Thus, the output signal of the flux locked loop 22 is proportional to the change in the magnetic field linked with the DC SQUID sensor 13, provided that the dynamic range and slew rate of the sensor 13 and flux locked loop 22 are not exceeded. The flux locked loop 22 comprises twelve major components: a DC/RF matching circuit 40; RF controlled-impedance bias tee 41; at least one bias source 42; at least one RF low noise amplifier 43; an RF bandpass filter 44; an RF mixer 45; an RF square wave flux modulation source 46; an RF phase setting circuit 47; a sharpener circuit 48; an RF amplitude setting circuit 49; an integrator 50; an RF matching combiner 51; an RF low noise buffer 52; and an RF low noise matching circuit 53. FIG. 4 illustrates a preferred embodiment of the sharpener circuit 48, wherein an output voltage 90 is attenuated before being sent to the RF matching combiner 51 (see FIG. 3). It is preferable to shield the flux locked loop 22 from radio-frequency interference. The flux locked loop 22 is described in detail in the copending application entitled "A Fast Flux Locked Loop", Ser. No. 09/596,135, filed on Jun. 16, 2000.

4. Post-Loop Signal Processor 26

Referring to FIGS. 1 and 2, the post-loop signal processor 26 performs two main functions: it extracts the desired signal from the noise and interference and determines and outputs the amplitude and phase response of the desired signal relative to the amplitude and phase of the reference sinusoidal source, and, in one preferred embodiment, it produces the sinusoidal excitation signal which is sent to the excitation drive 18 and which is ultimately used to magnetically stimulate the unit under test 15. Individual components of the post-loop signal processor 26 may be implemented with hardware or with digital signal processing technology (DSP); DSP is preferred where applicable. If DSP is used, then the post-loop signal processor 26 comprises an interference and anti-alias filter component 40, an analog-to-digital converter 41, and a digital signal processor 42.

The interference and anti-alias filter component 40 receives the signal output by the flux locked loop 22, which contains interference signals having frequencies both below and above the frequency of the excitation signal, and greatly reduces low-frequency interference (typically generated by 50/60 HZ power lines) by high-pass filtering and high-frequency interference (typically AM broadcast and similar signals) by low-pass filtering. Thus, the interference and anti-alias filter component 40 comprises application specific low pass and high pass filters. The low pass filter also serves as the anti-alias filter required by the analog-to-digital converter 41. The filtered signal is composed primarily of the desired signal and undesired noise, and has a dynamic range that is manageable, since the largest magnitude interfering signal (50/60 HZ) has been greatly reduced by filtering, by current state-of-the-art analog-to-digital convertors.

The preferred anti-alias filter is a non-traditional filter without which the sinusoidal correlator 62, described below, will not operate as efficiently. The anti-alias filter is an 8-pole elliptic lowpass filter with the notch frequencies set primarily at the fundamental and harmonic frequencies of the sample rate of the analog-to-digital converter 41. The individual filter stage pole frequencies and Q's, however, are modified in such a way that the passband response is linear phase. This results in excellent transient response which aids the sinusoidal correlator 41 in averaging out the high frequency components of broadband noise present in the input signal. Both the reference and input channels into the digital signal processor are filtered through identical alias filters, and any sloping of the input signal passband response can be compensated and calibrated out by measuring the passband response in the reference channel.

The analog-to-digital converter 41 digitizes the signal output by the interference and alias filter component 40. Proper selection of the analog-to-digital converter 41 is important and is application dependent. Two possible choices among analog-to-digital (A/D) converters are successive approximation and sigma-delta. Successive approximation A/D converters are commonly used in instrumentation applications and are readily available in 16-bit resolution, 200 kHz sample rate configuration. Sigma-delta A/D converters are commonly used in audio music and voice applications and are readily available in 24-bit resolution, 44–48 kHz configuration. The anti-alias filter described above is usable with the 16-bit successive approximation-type A/D converter. To be usable with the sigma-delta-type A/D converter, the number of filter poles must be increased appropriately.

The use of a sharp anti-alias filter as described here with a sigma-delta A/D converter is not common practice because the audio music and voice applications that sigma-delta converters are commonly used for have a large desired signal, a very low source noise level and a source noise bandwidth that is restricted by the input devices (e.g., microphones). DC SQUID systems, however, have a high noise-to-signal ratio and a wide noise bandwidth characterized by significant white noise content that extends beyond the sample frequency of the A/D converter. Because of this, the desired signals are often buried in wideband noise, so that the sigma-delta converter, as is also the case with the successive approximation converter, must be preceded by a sharp anti-alias filter. Without such a filter, the large amplitude wideband gaussian white noise will, in the time domain, resemble successive input step functions rather than a continuous signal. These repetitive step functions cause the internal digital filters in the sigma-delta converter to ring, thereby adding distortion and destroying the buried small desired signal. Sigma-delta A/D converters are therefore unusable without the sharp anti-alias filter. Successive approximation filters have no internal digital filters.

With the appropriate anti-alias filter, either type of A/D converter is preferred depending on the application. The sigma-delta converter clearly has increased dynamic range commensurate with the increased bit count, but is restricted to lower sample rates. In applications requiring high sample rates and less dynamic range, flash-type AND converters could be used. Of course, if the post-loop signal processor 26 is implemented using hardware, then the analog-to-digital converter 41 may not be required.

Figure 5:
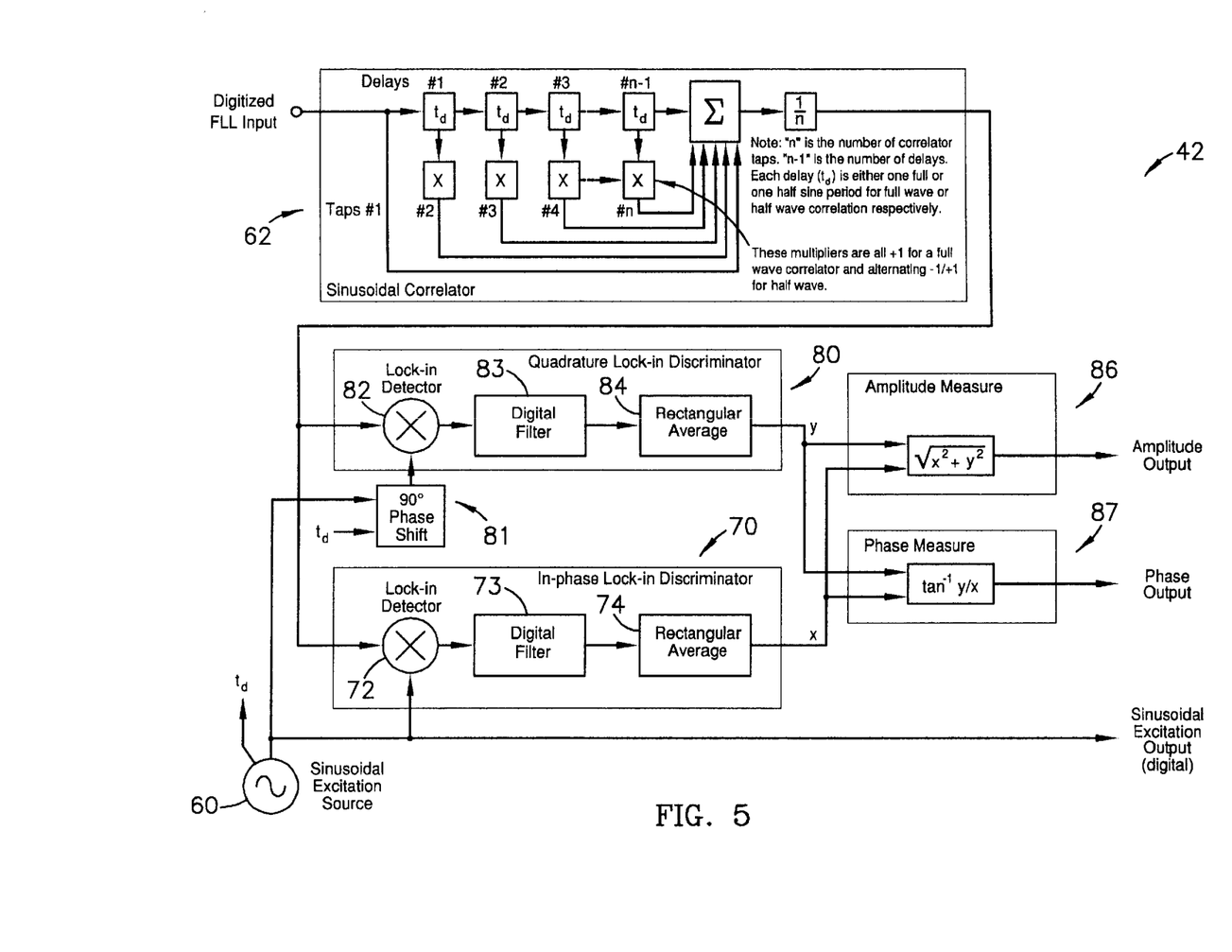
FIG. 5 is block diagram illustrating a first preferred embodiment of the digital signal processing component of the present invention.
Figure 6:
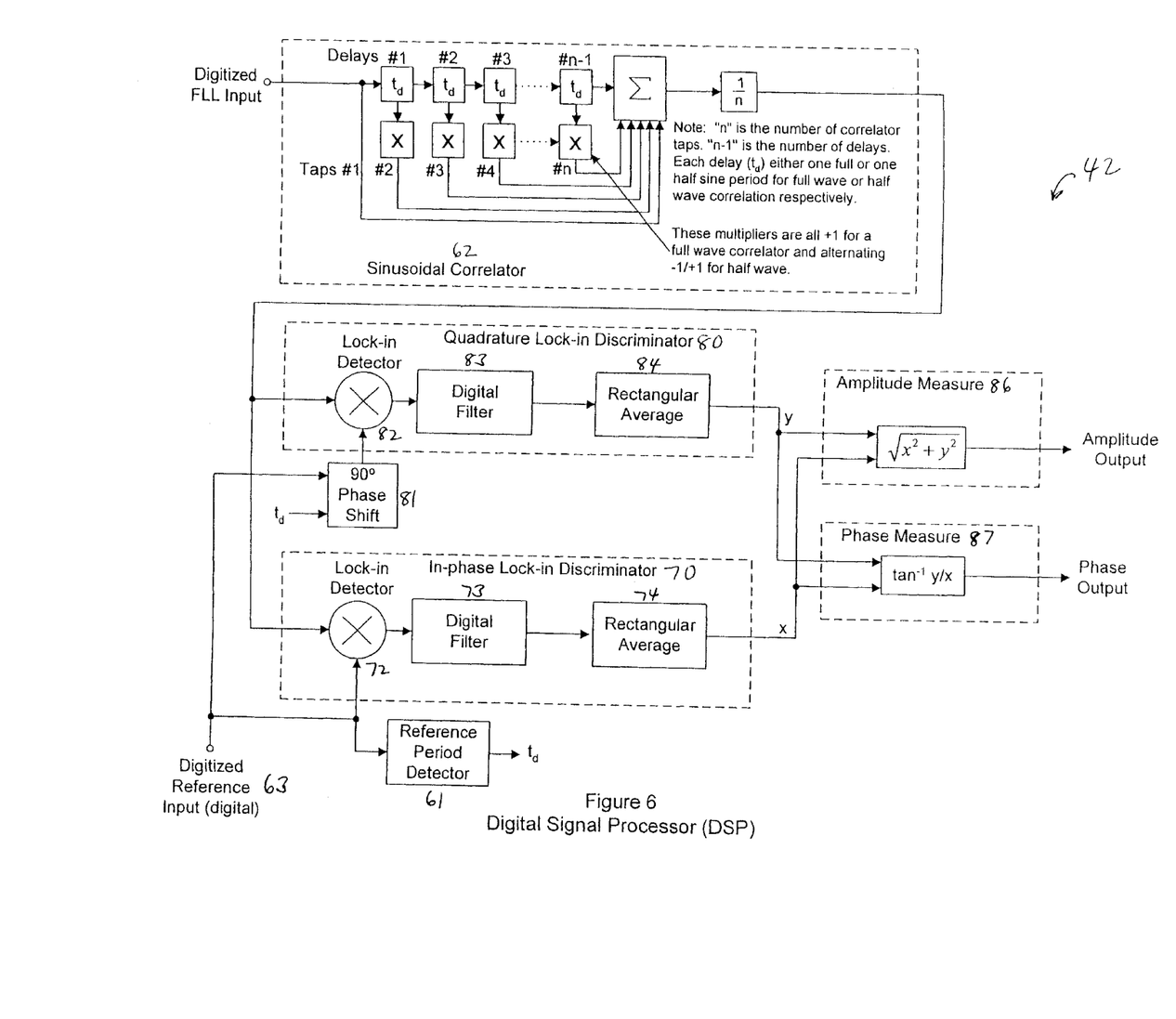
FIG. 6 is a block diagram illustrating a second preferred embodiment of the digital signal processing component of the present invention.

Referring to FIG. 5, the preferred digital signal processor 40 performs six main functions, consisting of acting as: a low-distortion sinusoidal excitation source 60; a sinusoidal correlator 62; an in-phase lock-in discriminator 70; a quadrature lock-in discriminator 80; an amplitude measure 86; and a phase measure 87. In FIG. 6, wherein there is no low distortion sinusoidal excitation source and the sinusoidal excitation signal is not generated in the post-loop signal processor 26, the post-loop signal processor 26 is shown performing a seventh function, that of determining the period of the externally generated reference signal. A listing of source code for implementing the functions of the digital signal processor 40 may be found at the end of the current entitled DETAILED DESCRIPTION OF THE PREFERRED EMBODIMENT and before the section entitled CLAIMS. With regard to the sinusoidal correlator 62, the source code implements only the full-wave version, but is easily adapted to implement the half- or quarter-wave versions described below Referring to FIG. 5 again, the low-distortion sinusoidal excitation source 60 is an algorithm that produces a high spectral purity digital representation of a sinusoidal wave (such algorithms include Taylor series, lookup table, and cordic). The sinusoidal excitation source 60 may be implemented using hardware external to the post-loop signal processor 26, rather than as a DSP algorithm within the post-loop signal processor 26 (see FIG. 2).

The sinusoidal correlator 62 functions to greatly reduce the random noise and interference signal components of the signal that are not correlated with the sinusoidal excitation signal. The sinusoidal correlator 62 of the present invention can be implemented in hardware or in a DSP firmware algorithm; DSP is preferred. The input to the sinusoidal correlator 62 is the digitized flux locked loop signal that has had some of the interference signals removed by the filters of the interference and alias filter component 24, shown in FIGS. 1 and 2. The sinusoidal correlator 62 makes use of the fact that each periodic repetition, or cycle, of a sinusoidal signal's waveform has the same shape as every other cycle, regardless of the initial phase of each cycle. In addition, the sinusoidal correlator 62 makes use of the fact that each one-half cycle of a sinusoidal waveform has the same shape, though inverted, as the previous one-half cycle. This doubles the effective sampling rate and effectively halves the processing time.

Similarly, the sinusoidal correlator 62 can also make use of the property of the desired signal that each quarter-cycle of the waveform has the same shape as other quarter cycles, but is inverted in time as well as in magnitude. The processing time of a half-wave sinusoidal correlator can be halved again by making use of this quarter-wave symmetry.

Sinusoidal correlation is carried out by means of an "analog-like" DSP-quantitized delay line that has individual taps, with a delay per tap ($t_d$) equal to either one or one-half the period of the sinusoidal reference signal for full- or half-wave correlators respectively. For the half-wave correlator only, alternate taps are first inverted in sign, and then all of the taps are summed together. The resulting sum is multiplied by the inverse of the number of taps. Alternatively, though not preferred, each tap may be multiplied, before summation, by the inverse of the number of taps. During summation, the component of the input signal that has the same period as the excitation signal sums coherently. All random signals and all signal components that have periods not harmonically related to the excitation sum incoherently. This results in a net reduction in the noise level which is approximately equal to the square root of the number of taps. Thus, the output signal produced by the sinusoidal correlator 62 has a greatly improved signal-to-noise ratio.

The output signal from the sinusoidal correlator 62 is sent to the in-phase and quadrature lock-in discriminators 70,80, which are well-known in the art. The in-phase and quadrature lock-in discriminators 70,80 are identical except that the quadrature lock-in discriminator first phase shifts the reference signal by 90° in order to detect that component of the input signal which is in phase quadrature with the reference signal. This phase shift is accomplished by a phase shift function 81.

The first stage of the in-phase and quadrature lock-in discriminators 70,80 is the lock-in detector 72,82 which multiplies the input signal by the excitation signal produced by either the low-distortion sinusoidal excitation source 60 (see FIG. 5) or the digitized reference input 63 (see FIG. 5). This creates spectral components representing the component of the desired signal that is in phase with the excitation signal at zero frequency (DC) and at twice the excitation source frequency. Noise and interfering spectral components in the input signal that are near the frequency of the excitation signal also appear in the output near the same frequencies as the desired signal. Spectral components that are not near DC are removed by the digital filter 73,83 following the lock-in detector 72,82. The digital filter 73,83 can typically be implemented with either a finite impulse response (FIR) or an infinite impulse response (IIR) type filter. The digital filter 73,83 output is then input to the rectangular average function 74,84. The rectangular average function 74,84, which may be implemented as either a fixed or moving average type, significantly reduces the remaining low frequency noise and interference spectral components and smoothes out the response of the digital filter 73,83. The outputs of the in-phase and quadrature lock-in discriminators 70,80 are sent to the amplitude and phase measure functions 86,87.

The amplitude measure function 86 recovers the amplitude of the sinusoidal input signal input into the in-phase and quadrature lock-in discriminators 70,80 by calculating the square root of the sum of the squares of the outputs of the in-phase and quadrature lock-in discriminators 70,80 and correcting for anti-alias filter calibrations as needed.

The phase measure function 87 recovers the phase of the sinusoidal in put signal into the in-phase and quadrature discriminators 70,80 relative to the phase of the sinusoidal source by calculating the arctangent of the ratio of the outputs of the in-phase and quadrature lock-in discriminators.

5. Post-Loop Signal Processor 26 Read-Out

Referring to FIGS. 1 and 2, when a measurement is completed, the amplitude and phase of the flux lock loop signal, which is proportional to the amplitude and phase of the sinusoidal excitation magnetic field sensed by the DC SQUID sensor 13 in the unit under test 15, are output from the post-loop signal processor 26.

From the preceding description, it can be seen that the present invention alleviates the problems of high levels of magnetic interference encountered when making DC SQUID measurements in magnetically unshielded environments, and results in a tracking slew rate that is at least ten times better than the prior art. More particularly, the present invention incorporates innovative circuit designs that extend the frequency of operation of flux locked loops, thus enabling an FLL with post-loop signal processing to track and remove undesired magnetic interference and eliminating the need for magnetic shielding. Furthermore, the present invention incorporates digital signal processing algorithms to extract the desired weak DC SQUID signal from the remaining noise and interference, and then precisely measuring the magnetic field signal characteristics.

Although the invention has been described with reference to the preferred embodiment illustrated in the attached drawings, it is noted that equivalents may be employed and substitutions made herein without departing from the scope of the invention as recited in the claims. Furthermore, the present invention is for read-out electronics which are independent of and can be adjusted to a variety of DC SQUID sensors.

The following is a listing of source code for implementing the functions of the digital signal processor 40:

SQUID Post-Loop DSP Software (c) 2000 Honeywell FM&T squid.c :Hardware platform is Bittware Snaggletooth-PCI with a Bitsi-BIN. This program uses the ADCs and DACs with an internal clock.

```
/************************ start of squid.c ************************/
#include <def21060.h>
#include <21060.h>
#include <signal.h>
#include <sport.h>
#include <macros.h>
#include <filters.h>
#include <math.h>
#include <stdlib.h>
#include "bitsibin.h"
#define GetIOP(addr) (* (int *) addr)
#define CORR_MEM 3024          // Total correlator memory (63 * 48)
#define TAPS 93                // Number of fir filter taps
#define RAD_DEG 57.2957795     // Radians to degrees conversion factor
        //GLOBAL VARIABLES
int period = 48;               // Initial sin/cos period (samples/cycle)=48.
int control = 0;
int control_read = 0;          // Readback of the control register
```

-continued

```
int clock_select;                    // clock select variable for byte swapping.
int data_ready = 0;
int count = 0;
int *bitsi_base;
int ad0 = 0;                         // Initialize A/D variables.
int ad1 = 0;
int ad2 = 0;
int ad3 = 0;
int ad4 = 0;
int ad5 = 0;
int ad6 = 0;
int ad7 = 0;
int *ad0_ptr;                        // Pointers to memory-mapped A/D
                                     converters
int *ad1_ptr;
int *ad2_ptr;
int *ad3_ptr;
int *ad4_ptr;
int *ad5_ptr;
int *ad6_ptr;
int *ad7_ptr;
int dac0 = 0;                        // Initialize D/A variables.
int dac1 = 0;
int dac2 = 0;
int dac3 = 0;
int *dac0_ptr;                       // Pointers to memory-mapped D/A
                                     converters
int *dac1_ptr;
int *dac2_ptr;
int *dac3_ptr;
int i=0;
int j=0;
int volatile sc_state = -1;          // Position marker for sin/cos output
int volatile master_state = -1;
int volatile test_out_1 = 0;
int volatile test_out_2 = 0;
int volatile cnt = 0;
int volatile done = 1;
int volatile init = 1;
float volatile sin_scaled[48];       // Amplitude scaled sin lookup table
float volatile cos_scaled[48];       // Amplitude scaled cos lookup table
float volatile output_level = .8;    // Output amplitude scale factor [0–1]
int volatile skip = 0;               // Number of table entries to skip
float pm sin_value[48];
float pm cos_value[48];
float pm sin_value_48[48] =          // Sin lookup table source [0–1]
    {
    #include "sintable48.h"
    };
    float pm cos_value_48[48] =      // Cos lookup table source [0–1]
    {
    #include "costable48.h"
    };
float volatile corr_input_1 = 0.0;   // Correlator input
float volatile corr_output_1 = 0.0;  // Correlator output
float volatile corr_input_2 = 0.0;   // Correlator input
float volatile corr_output_2 = 0.0;  // Correlator output
float volatile corr_step = 0.0;      // Intermediate corr. value
CIRCULAR_BUFFER(float, 1, pntr);     // Declare buffer
float corr_array[CORR_MEM];          // Array for circular buffer
float i_filter_input = 0.0;
float q_filter_input = 0.0;
float i_filter_output = 0.0;
float q_filter_output = 0.0;
float pm i_coeffs[TAPS] =            // Setup fir filter coefficients
    {                                // tables from external file
    #include "coef93.h"
    };
    float pm q_coeffs[TAPS] =
    {
    #include "coef93.h"
    };
float i_state[TAPS+1];
float q_state[TAPS+1];
float i_sum = 0.0;
float q_sum = 0.0;
float i_average = 0.0;
float q_average = 0.0;
float magnitude = 0.0;
```

-continued

```
float phase_rad = 0.0;
float phase = 0.0;
int timer_setup = 0x00330000;          // Set timer to 48.08 kHz
int loop_forever = 1;
//------------------------------------------------------------------------
void setup_bitsi_bin(void)
    {
    ad0_ptr = AD0;                     // initialize pointers to A/D converters
    ad1_ptr = AD1;
    ad2_ptr = AD2;
    ad3_ptr = AD3;
    ad4_ptr = AD4;
    ad5_ptr = AD5;
    ad6_ptr = AD6;
    ad7_ptr = AD7;
    dac0_ptr = DAC0;                   // Initialize pointers to D/A converters
    dac1_ptr = DAC1;
    dac2_ptr = DAC2;
    dac3_ptr = DAC3;
    CONTROL = control;                 // Initialize D/As to 0v, clocks disabled
    AD_CLK_SEL = timer_setup;          // Set timers for 48.08 kHz (20.8 us)
    DA_CLK_SEL = timer_setup;          // 0x33 = 52-1 = (2.5 MHz/(48 kHz)) - 1
    control = 0x00070000;              // Enable clocks & D/As
    CONTROL = control;                 // Send "control" settings to CONTROL
    }
//------------------------------------------------------------------------
#define MSIZE_BITS 0x0000F000
#define MSIZE_SHIFT 12
#define MS0_BASE 0x00400000
#define MSIZE0_SIZE 0x00002000
int *get_ms_base(int msnum)
{
int msize;
int *dms;
msize = ((GetIOP(SYSCON) & MSIZE_BITS) >> MSIZE_SHIFT);
                                       // Get offset to correct base memory.
dms = (int *) (MS0_BASE + (msnum * (MSIZE0_SIZE << msize)));
return(dms);
}
//------------------------------------------------------------------------
void irq_handler(int irq_num)
    {
    data_ready = 1;
    sc_state++;
    sc_state %= period;
    master_state = sc_state;
    count++;
    }
//------------------------------------------------------------------------
void main (void)
    {
    while (loop_forever)               // Loop forever
        {
if (init)
    {
        // INIT STATE ARRAYS FOR FIR FILTERS
        for (i=0; i<TAPS+1; i++)
        {
        i_state[i] = 0.0;
        q_state[i] = 0.0;
        };
        // INIT SCALED SINE/COSINE TABLES
for(i=0; i<48;i++)
    {
    sin_value[i] = 0.0;                // Zero arrays
    cos_value[i] = 0.0;
    sin_scaled[i] = 0.0;
    cos_scaled[i] = 0.0;
    };
skip = 48/period;
for (i=0; i<period; i++)
    {
    sin_value[i] = sin_value_48[i*skip];
    cos_value[i] = cos_value_48[i*skip];
    sin_scaled[i] = (sin_value[i] * 32767.0 * output_level);
    cos_scaled[i] = (cos_value[i] * 32767.0 * output_level);
    sin_value[i] = 2.0 * sin_value[i]; // Compensate mixer loss
    cos_value[i] = 2.0 * cos_value[i];
    };
```

```
                                            -continued

// INIT CORRELATOR MEMORY
BASE(pntr) = corr_array;                            // Set DAG b register
LENGTH(pntr) = CORR_MEM;                            // Set DAG l register
            // INIT BITSI HARDWARE AND ENABLE INTERRUPTS
        bitsi_base = get_ms_base(BITSI_SPACE);      // Get bitsi base address
        setup_bitsi_bin();
        asm("BIT SET MODE2 0x00000004;");           // Make IRQ0 edge-sensitive
        interrupts(SIG_IRQ2, irq_handler);          // Interrupt for sample
        init = 0;
        }
            // MAIN PROCESSING
if(data_ready)                                      // Do nothing until data_ready is set in ISR
    {
            // GET A/D INPUT DATA
        ad0 = *ad0_ptr;
        ad0 = *ad0_ptr>>16;
        corr_input_1 = (float) (ad0);               // Get input sample
        ad1 = *ad1_ptr;
        ad1 = *ad1_ptr>>16;
        corr_input_2 = (float) (ad1);
            // OUTPUT DAC DATA
        dac0 = (int) corr_output_1;
        //dac1 = (int) corr_output_1;
        *dac0_ptr = (dac0<<16);
        //*dac1_ptr = (dac1<<16);
        dac2 = (int) sin_scaled[sc_state];
        *dac2_ptr = (dac2<<16);
        if(done == 0)
            {
            // N=64 TAP SINUSOIDAL FULL WAVE CORRELATOR
        asm ("r1=dm(_pntr);");                      // Setup DAG1
        asm ("r5=dm(_base_pntr);");
        asm ("r9=dm(_length_pntr);");
        asm ("B1=r5;");
        asm ("L1=r9;");
        asm ("I1=r1;");
        asm ("M1=dm(_period);");                    // Samples between taps
        asm ("f2=dm(_corr_input_1);");              // Get current sample
        asm ("f1=dm(I1,M1);");                      // Get newest tap value
        asm ("LCNTR=62, D0 corr UNTIL LCE;");       // Setup for all taps
        asm ("corr: f2=f2+f1, f1=dm(I1,M1);");      // Add tap value, fetch next
        asm ("f2=f2+f1;");                          // Add oldest tap value
        asm ("dm(_corr_output_1 )=f2;");            // Save resulting sum
            CIRC_WRITE(pntr,1,corr_input_1,dm);     // Overwrite oldest sample
        corr_output_1 = corr_output_1 * 0.015625;   // Scale the sum (1/N)
            // HARD LIMITERS
if (corr_output_1 > 32767.0)                        //Hard limit +
corr_output_1 = 32767.0;
if (corr_output_1 < -32767.0)                       //Hard limit -
corr_output_1 = -32767.0;
// MIXERS
i_filter_input = corr_output_1 * sin_value[sc_state];   // I mixer
q_filter_input = corr_output_1 * cos_value[sc_state];   // Q mixer
// FIR FILTERS
        i_filter_output = fir(i_filter_input, i_coeffs, i_state, (int) TAPS);
        q_filter_output = fir(q_filter_input, q_coeffs, q_state, (int) TAPS);
            // RECTANGULAR AVERAGING
        if (cnt >= 3200)
            {
            i_sum += i_filter_output;               // Running sums for averaging
                q_sum += q_filter_output;
            i_average = i_sum * 0.00005952381;      // Find I average
            q_average = q_sum * 0.00005952381;      // Find Q average
            }
        if (cnt++>=20000)
            {
            // CALCULATE MAGNITUDE AND PHASE
            magnitude = sqrtf (i_average * i_average + q_average * q_average);
            phase_rad = atan2f (q_average , i_average);
            phase = phase_rad * RAD_DEG;
            i_sum = 0;                              // Reset averaging sums
            q_sum = 0;
            i_average = 0.0;                        // Reset averages
            q_average = 0.0;
            done = 1;                               // Flag indicating measure completion
            cnt = 0;
            corr_output_1 = 0;
            }
        }                                           // end of done==0 loop
```

```
                -continued data_ready = 0;              // Clear data_ready flag
  }                              // end of data_ready if
}                                // end of forever loop
dac0 = (int) 0;                  // Set DAC outputs to zero
*dac0_ptr = (dac0<<16);
dac2 = (int) 0;
*dac2_ptr = (dac2<<16);
exit();
}                                // end of main
/*************************** end of squid.c ***************************/
```

Having thus described the preferred embodiment of the invention, what is claimed as new and desired to be protected by Letters Patent includes the following:

1. Read-out electronics for use with a direct current superconducting quantum interference device, the direct current superconducting quantum interference device being cryogenically cooled and located within a cryogenic environment and operable to detect a magnetic field and having a characteristic impedance, the read-out electronics comprising:

a flux locked loop operable to provide a feedback signal to the direct current superconducting quantum interference device, the feedback signal having certain signal characteristics, the feedback signal being proportional to the magnetic field at the direct current superconducting quantum interference device, the flux locked loop having at least one characteristic impedance;

a post-loop signal processor operable to determine the signal characteristics of the feedback signal produced by the flux locked loop and to generate an excitation signal;

an excitation drive and excitation coil operable to receive and enhance the excitation signal produced by the post-loop signal processor and to apply the excitation signal to a test subject; and at least one transmission line coupling the direct current superconducting quantum interference device to the flux locked loop, the transmission line having a characteristic impedance.

2. The read-out electronics of claim 1, the read-out electronics further comprising at least one impedance matching circuit located within the cryogenic environment and operable to match the impedance of the direct current superconducting quantum interference device to the impedance of the transmission line and the flux locked loop.

3. The read-out electronics of claim 2, the impedance matching circuit being a direct current radio-frequency impedance matching circuit.

4. The read-out electronics of claim 1, the post-loop signal processor being separate and distinct from the flux locked loop and located outside of the flux locked loop.

5. The read-out electronics of claim 1, the post-loop signal processor comprising an interference and anti-alias filter component, an analog-to-digital converter, and a digital signal processor, the interference and anti-alias filter component being operable to high pass filter and low pass filter the feedback signal produced by the flux locked loop, the analog-to-digital converter being operable to digitize signals for input into the digital signal processor.

6. The read-out electronics of claim 5, the digital signal processor comprising:

a low distortion excitation source operable to produce an excitation signal;

a sinusoidal correlator operable to reduce the random noise and other non-coherent spectral components of an input signal;

an in-phase lock-in discriminator operable to multiply the input signal and the excitation signal to produce a first resulting signal having an amplitude and a phase and spectral components, and further operable to remove the undesired spectral components of the first resulting signal;

a quadrature lock-in discriminator operable to phase shift the excitation signal, and further operable to multiply the input by the phase-shifted excitation signal to produce a second resulting signal having an amplitude and a phase and spectral components, and further operable to remove the undesired spectral components of the second resulting signal; and amplitude and phase measuring algorithms operable to measure the amplitude and phase of the input signal by use of the first and second resulting signals.

7. The read-out electronics of claim 1, the excitation drive comprising a reconstruction filter, a buffer amplifier, and a digital-to-analog converter.

8. The read-out electronics of claim 1, the transmission line being a radio-frequency shielded, controlled-impedance transmission line which may be of any characteristic impedance.

9. The read-out electronics of claim 1, the transmission line being coaxial cable.

10. The read-out electronics of claim 1, the transmission line being stripline.

11. The read-out electronics of claim 1, the transmission line having a characteristic impedance of 50 Ohms.

12. The read-out electronics of claim 1, the transmission line being impedance matched at both ends.

13. The read-out electronics of claim 1, the transmission line being impedance matched at only one end.

* * * * *